United States Patent
Khanoyan et al.

(10) Patent No.: US 7,358,782 B2
(45) Date of Patent: Apr. 15, 2008

(54) FREQUENCY DIVIDER AND ASSOCIATED METHODS

(75) Inventors: Karapet Khanoyan, Lake Forest, CA (US); Mark Chambers, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/350,143

(22) Filed: Feb. 9, 2006

(65) Prior Publication Data

US 2007/0040593 A1 Feb. 22, 2007

Related U.S. Application Data

(60) Provisional application No. 60/708,758, filed on Aug. 17, 2005.

(51) Int. Cl.
*H03B 19/00* (2006.01)

(52) U.S. Cl. .................. 327/117; 327/115; 377/47; 377/48

(58) Field of Classification Search ............... 327/117, 327/113, 115, 118; 365/189.07, 233; 331/25, 331/12; 377/47, 48
See application file for complete search history.

(56) References Cited

U.S. PATENT DOCUMENTS

| | | | | |
|---|---|---|---|---|
| 5,524,035 A | * | 6/1996 | Casal et al. | 377/47 |
| 5,729,179 A | * | 3/1998 | Sumi | 331/12 |
| 5,995,420 A | * | 11/1999 | Hesley | 365/189.07 |
| 6,066,990 A | * | 5/2000 | Genest | 331/25 |
| 6,445,227 B1 | * | 9/2002 | Quirmbach et al. | 327/115 |
| 6,667,638 B1 | * | 12/2003 | Kramer et al. | 327/115 |
| 2004/0036513 A1 | * | 2/2004 | Gibbons | 327/117 |
| 2005/0258879 A1 | * | 11/2005 | Marutani | 327/117 |

OTHER PUBLICATIONS

Millman et al., *Microelectronics*, McGraw-Hill, Inc. 1987, 2$^{nd}$ Edition, pp. 318-325 and 329-340.

* cited by examiner

*Primary Examiner*—Tuan T. Lam
*Assistant Examiner*—Diana J Cheng
(74) *Attorney, Agent, or Firm*—Sterne, Kessler, Goldstein & Fox PLLC

(57) ABSTRACT

The present invention relates to frequency dividers. The frequency divider comprises an input, a counter, a first comparator, an interconnect, and an output. The counter has a counter reset port and is configured to receive a clock signal from the input and to produce a sum signal. The first comparator is configured to receive the sum signal, to compare the sum signal to a first integer, and to produce a first comparison signal. The interconnect is configured to convey the first comparison signal from the first comparator to the counter reset port. The output coupled to the first comparator. The clock signal has a periodic waveform. The sum signal represents a first sum, which equals a number of waveforms of the clock signal received by the counter after the counter has been reset. In a first embodiment, the first integer is selectable from a set of at least three consecutive integers. In a second embodiment, a frequency of the clock signal is at least 1.5 gigahertz. A third embodiment includes the features of both the first embodiment and the second embodiment.

13 Claims, 12 Drawing Sheets

FREQUENCY DIVIDER AND ASSOCIATED METHODS

CROSS-REFERENCE TO RELATED APPLICATIONS

This application claims the benefit of U.S. Provisional Application No. 60/708,758, filed Aug. 17, 2005, which is incorporated herein in its entirety by reference.

BACKGROUND OF THE INVENTION

1. Field of the Invention

The present invention relates to frequency dividers.

2. Related Art

The wide proliferation of wireless products depends upon components that can convert a signal from one frequency to another. Accordingly, such components must be able to operate at different frequencies. Often such components include frequency dividers. Frequency dividers receive an input signal at a first frequency and produce an output signal at a second frequency. The second frequency is the quotient of the first frequency divided by an integer. For ultra high frequency operations, custom designed analog frequency dividers are often used. Although programmable frequency dividers have been designed to support division by more than one integer, typically the set of integers that can be used is small and excludes large odd integers. Furthermore, from an integrated circuit design perspective, analog frequency dividers occupy a substantial amount of substrate area, consume significant amounts of static power, and are generally not easily transferable from one component design to another. What is needed is a frequency divider that can be programmed to divide the frequency of an input signal by several integers, including large odd integers. Preferably, such a frequency divider would also be capable of operating at ultra high frequencies.

BRIEF SUMMARY OF THE INVENTION

The present invention relates to frequency dividers. The frequency divider comprises an input, a counter, a first comparator, an interconnect, and an output. The counter has a counter reset port and is configured to receive a clock signal from the input and to produce a sum signal. The first comparator is configured to receive the sum signal, to compare the sum signal to a first integer, and to produce a first comparison signal. The interconnect is configured to convey the first comparison signal from the first comparator to the counter reset port. The output is coupled to the first comparator. The clock signal has a periodic waveform. The sum signal represents a first sum, which equals a number of waveforms of the clock signal received by the counter after the counter has been reset. In a first embodiment, the first integer is selectable from a set of at least three consecutive integers. In a second embodiment, a frequency of the clock signal is at least 1.5 gigahertz. A third embodiment includes the features of both the first embodiment and the second embodiment.

The frequency divider can further comprise a second comparator and a first flip-flop. The second comparator is configured to receive the sum signal, to compare the sum signal to a second integer, and to produce a second comparison signal. The flip-flop has a set port and a reset port and is configured to receive the first comparison signal at the set port, to receive the second comparison signal at the reset port, and to provide an output signal to the output. The first integer is greater than the second integer. In this embodiment, the frequency divider can further comprise multiplexer, a bypass, and a latch. The multiplexer is configured to couple, responsive to a selection either the latch or the bypass to a port. If the port is the set port, then the bypass is configured to receive the first comparison signal, the latch is configured to receive the first comparison signal, and the latch is configured to produce a delayed first comparison signal. If the port is the reset port, then the bypass is configured to receive the second comparison signal, the latch is configured to receive the second comparison signal, and the latch is configured to produce a delayed second comparison signal.

The present invention also relates to phase locked loops. The phase locked loop comprises an input, an output, a phase detector, a voltage controlled oscillator, and a frequency divider. The phase detector is configured to receive, from the input, a first signal, to receive a second signal, and to produce a third signal. The first signal has a first frequency. The second signal has a second frequency. The voltage controlled oscillator is configured to receive the third signal and to provide, to the output, a fourth signal. The fourth signal has a third frequency. The frequency divider is configured to receive the fourth signal and to produce the second signal. The second frequency equals the quotient of the third frequency divided by an integer. In a first embodiment, the integer is selectable from a set of at least three consecutive integers. In a second embodiment, the third frequency is at least 1.5 gigahertz and the frequency divider is formed using complementary metal oxide semiconductor processing technology. A third embodiment includes the features of both the first embodiment and the second embodiment.

The present invention also relates to methods for dividing a frequency of an input signal having a periodic waveform. In a first method, at a first step, a waveform of the input signal is received. At a second step, a sum is incremented in response to the received waveform. At a third step, the sum is compared with a first integer. At a fourth step, an output signal is set to a first level if the sum is different from the first integer. At a fifth step, the output signal is set to a second level if the sum equals the first integer and thereafter, at a sixth step, the sum is reset to an initial integer. Thereafter, at a seventh step, the first through seventh steps are repeated. The first integer is selectable from a set of at least three consecutive integers. The first level is either a high level or a low level. The second level is also either a high level or a low level, but the second level is different from the first level.

In a second method, at a first step, an output signal is set to a first level. At a second step, a waveform of the input signal is received. At a third step, a sum is incremented in response to the received waveform. At a fourth step, the sum is compared with a first integer. At a fifth step, the output signal is set to a second level if the sum equals the first integer. At a sixth step, the sum is compared with a second integer. At a seventh step, the output signal is set to the first level if the sum equals the second integer and thereafter, at an eighth step, the sum is reset to an initial integer. Thereafter, at a ninth step, the second through ninth steps are repeated. The second integer is greater than the first integer. The second integer is selectable from a set of at least three consecutive integers The first level is either a high level or a low level. The second level is also either a high level or a low level, but the second level is different from the first level.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention.

The present invention is now described with reference to the figures where like reference numbers indicate identical or functionally similar elements. Also in the figures, the left most digit(s) of each reference number identifies the figure in which the reference number is first used.

DETAILED DESCRIPTION OF THE INVENTION

Figure 1:
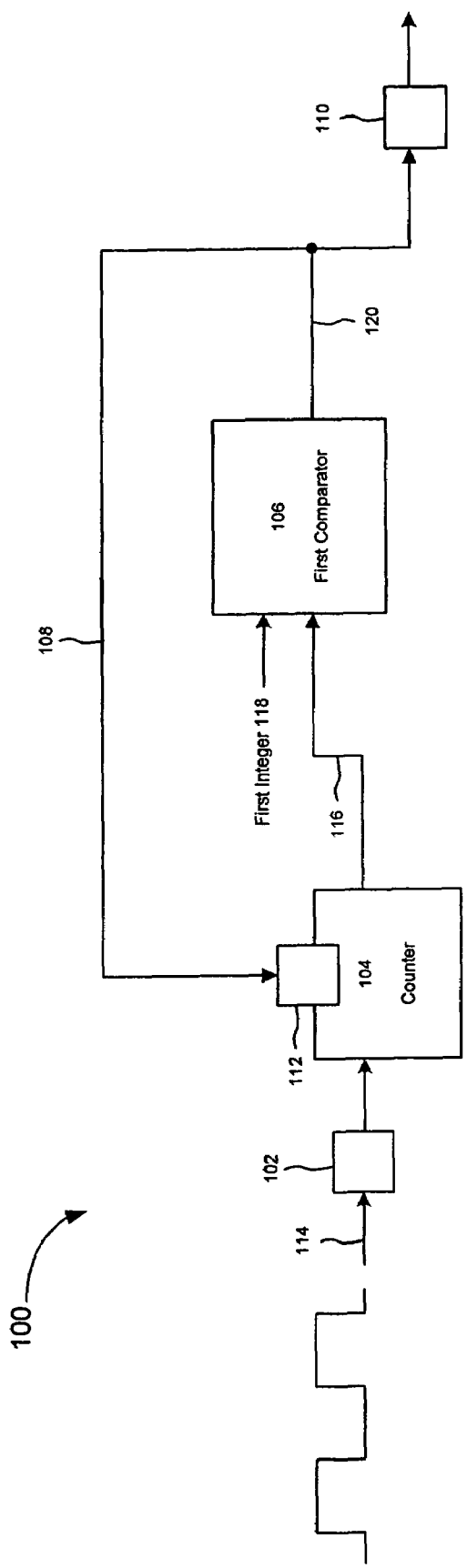
FIG. 1 is a block diagram of a frequency divider 100.

The present invention relates to frequency dividers. FIG. 1 is a block diagram of a frequency divider 100. Frequency divider 100 comprises an input 102, a counter 104, a first comparator 106, an interconnect 108, and an output 110. Counter 104 has a counter reset port 112. Counter 104 is configured to receive a clock signal 114 from input 102 and to produce a sum signal 116. First comparator 106 is configured to receive sum signal 116, to compare sum signal 116 to a first integer 118, and to produce a first comparison signal 120. Interconnect 108 is configured to convey first comparison signal 120 from first comparator 106 to counter reset port 112. Output 110 is coupled to first comparator 106.

In a first embodiment, first integer 118 is selectable from a set of at least three consecutive integers. A smallest integer of the at least three consecutive integers can be three. In a second embodiment, a frequency of clock signal 114 is at least 1.5 gigahertz. A third embodiment includes the features of both the first embodiment and the second embodiment.

Sum signal 116 represents a first sum, which equals a number of waveforms of clock signal 114 received by counter 104 after counter 104 has been reset. Alternatively, sum signal 116 can represent a second sum, which equals an initial integer added to the first sum. The initial integer can be zero, one, two, etc. This can be realized by having sum signal 116 set to the initial integer when counter 104 is reset. First comparison signal 120 is set to a high (low) value in response to sum signal 116 being equal to first integer 118 and is set to a low (high) value in response to sum signal 116 not being equal to first integer 118.

In frequency divider 100, if clock signal 114 is a substantially square wave, then first comparison signal 120 is a pulse signal with a period and a duty cycle. The period of first comparison signal 120 equals the product of first integer 118 multiplied by the period of clock signal 114. In this manner, frequency divider 100 divides the frequency of clock signal 114 by first integer 118. The duty cycle of first comparison signal 120 equals the quotient of one divided by first integer 118.

For example, if first integer 118 is six, then first comparison signal 120 is set to the high (low) value in response to counter 104 having received the sixth waveform of clock signal 114 after counter 104 has been reset. First comparison signal 120 is set to the low (high) value in response to counter 104 having received other than the sixth waveform of clock signal 114 after counter 104 has been reset. Thus, the period of first comparison signal 120 equals six times the period of clock signal 114 and the frequency of clock signal 114 has effectively been divided by six. The duty cycle of first comparison signal 120 equals one-sixth.

Figure 2:
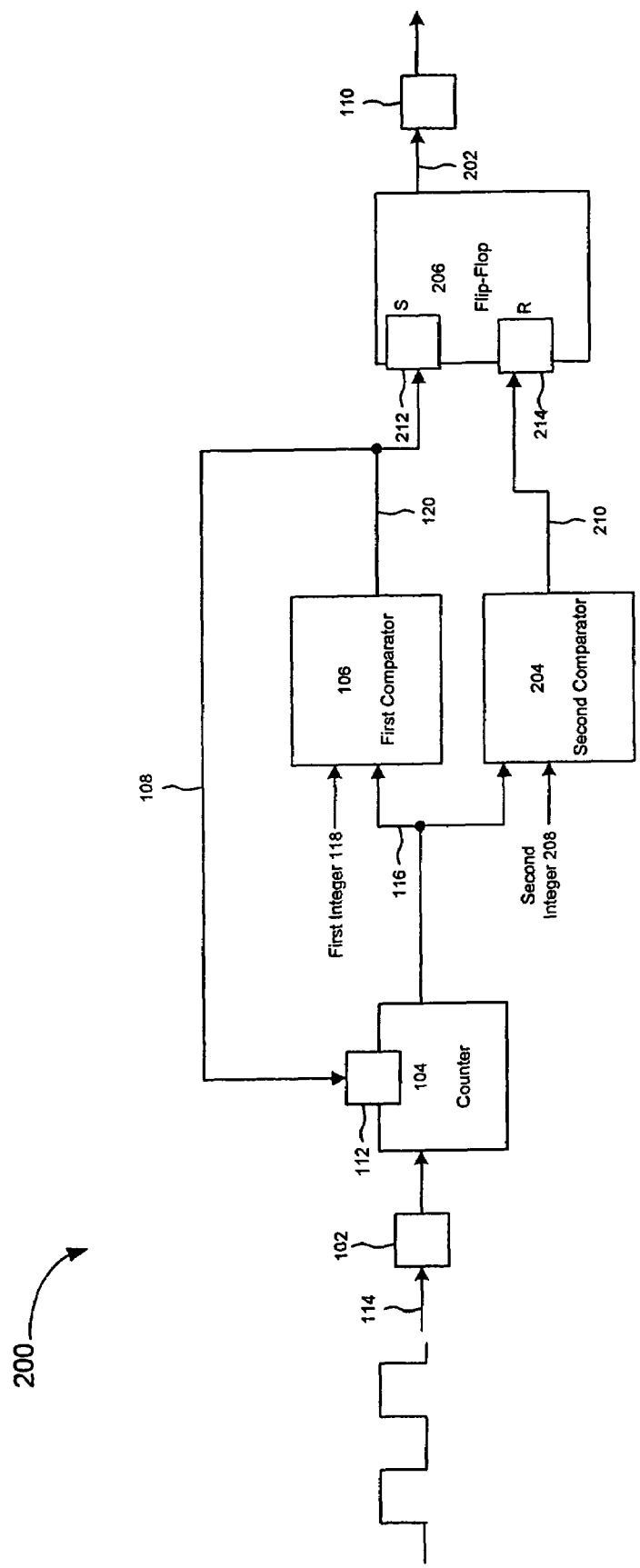
FIG. 2 is a block diagram of a frequency divider 200 that can produce an output signal 202 with a variable duty cycle.

FIG. 2 is a block diagram of a frequency divider 200 that can produce an output signal 202 with a variable duty cycle. Frequency divider 200 modifies frequency divider 100 to include a second comparator 204 and a flip-flop 206. Second comparator 204 is configured to receive sum signal 116, to compare sum signal 116 to a second integer 208, and to produce a second comparison signal 210. Flip-flop 206 has a set port 212 and a reset port 214. Flip-flop 206 is configured to receive first comparison signal 120 at set port 212, to receive second comparison signal 210 at reset port 214, and to provide output signal 202 to output 110. First integer 118 is greater than second integer 208.

First comparison signal 120 is set to the high (low) value in response to sum signal 116 being equal to first integer 118 and is set to the low (high) value in response to sum signal 116 not being equal to first integer 118.

Second comparison signal 210 is set to the high (low) value in response to sum signal 116 being equal to second integer 208 and is set to the low (high) value in response to sum signal 116 not being equal to second integer 208. Output signal 202 is set to the high (low) value in response to first comparison signal 120 being equal to the high (low) value and second comparison signal 210 being equal to the low (high) value. Output signal 202 is set to the low (high) value in response to second comparison signal 210 being equal to the high (low) value and first comparison signal 120 being equal to the low (high) value. Output signal 202 changes its value in response to both first comparison signal 120 and second comparison signal 210 being equal to the high (low) value. Output signal 202 maintains its value in response to both first comparison signal 120 and second comparison signal 210 being equal to the low (high) value.

In frequency divider 200, if clock signal 114 is a substantially square wave, then output signal 202 is a pulse signal with a period and a duty cycle. The period of output signal 202 equals the product of first integer 118 multiplied by the period of clock signal 114 such that frequency divider 200 divides the frequency of clock signal 114 by first integer 118. The duty cycle of output signal 202 equals the quotient of second integer 208 divided by first integer 118.

For example, if first integer 118 is six and second integer 208 is four, then output signal 202 is set to the high (low) value in response to counter 104 having received the sixth waveform of clock signal 114 after counter 104 has been reset, which again resets counter 104. Output signal 202 maintains the high (low) value in response to counter 104 having received, in turn, the first, the second, and the third waveform of clock signal 114 after counter 104 has been reset. Output signal 202 is set to the low (high) value in response to counter 104 having received the fourth waveform of clock signal 114 after counter 104 has been reset. Output signal 202 maintains the low (high) value in response to counter 104 having received the fifth waveform of clock signal 114 after counter 104 has been reset. Thus, the period of output signal 202 equals six times the period of clock signal 114 and the duty cycle of output signal 202 equals four-sixths (two-thirds).

Output signal 202 can have a substantially square waveform when first integer 118 equals the product of second integer 208 multiplied by two. For example, if first integer 118 is six and second integer 208 is three, then output signal 202 is set to the high (low) value in response to counter 104 having received the sixth waveform of clock signal 114 after counter 104 has been reset, which again resets counter 104. Output signal 202 maintains the high (low) value in response to counter 104 having received, in turn, the first and the second waveform of clock signal 114 after counter 104 has been reset. Output signal 202 is set to the low (high) value in response to counter 104 having received the third waveform of clock signal 114 after counter 104 has been reset. Output signal 202 maintains the low (high) value in response to counter 104 having received, in turn, the fourth and the fifth waveform of clock signal 114 after counter 104 has been reset. Thus, the period of output signal 202 equals six times the period of clock signal 114 and the duty cycle of output signal 202 equals three-sixths (one-half).

Figure 3:
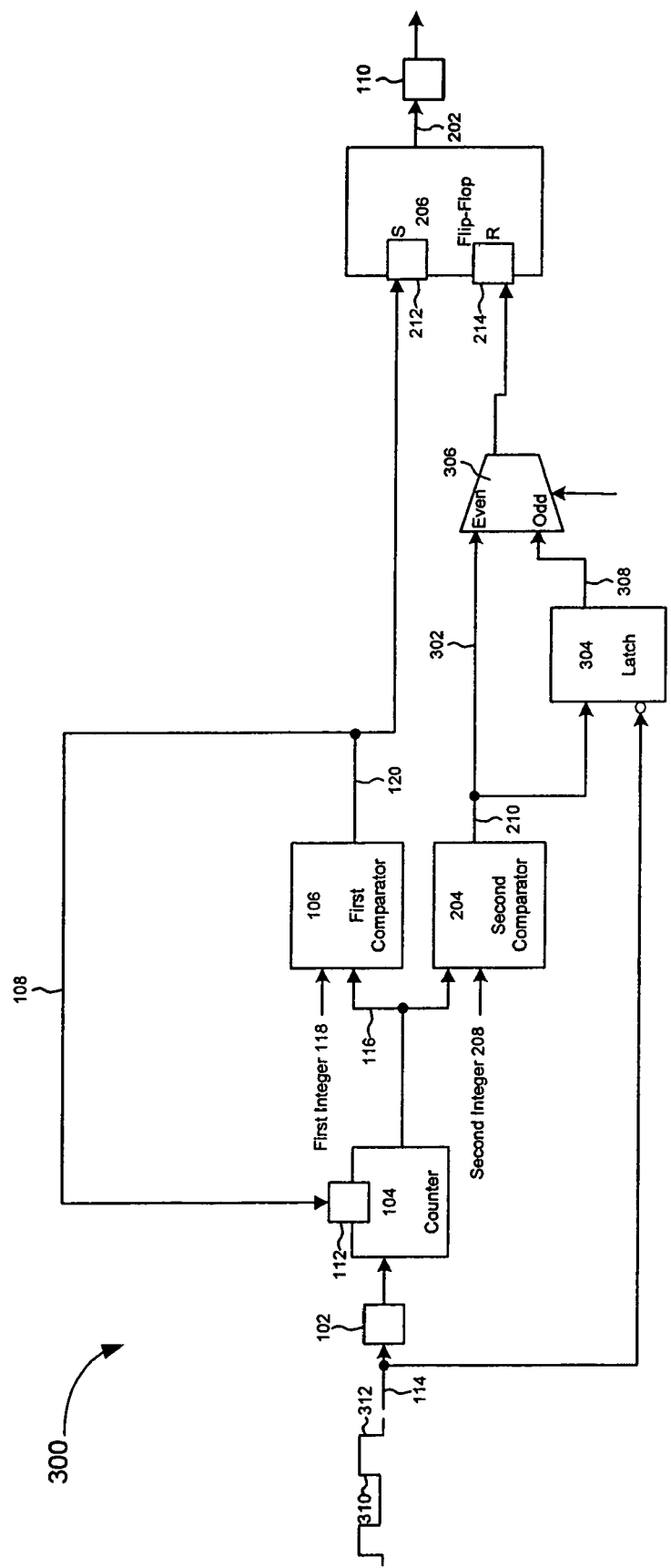
FIG. 3 is a block diagram of a frequency divider 300 that can produce output signal 202 with a substantially square waveform when first integer 118 is odd.

FIG. 3 is a block diagram of a frequency divider 300 that can produce output signal 202 with a substantially square waveform when first integer 118 is odd. Frequency divider 300 modifies frequency divider 200 to include a bypass 302, a latch 304, and a multiplexer 306. Bypass 302 is configured to receive second comparison signal 210. Latch 304 is configured to receive second comparison signal 210 and to produce a delayed second comparison signal 308. Multiplexer 306 is configured to couple, responsive to a selection, either latch 304 or bypass 302 to reset port 214. Multiplexer 306 can be configured to couple bypass 302 to reset port 214 if first integer 118 is even and to couple latch 304 to reset port 214 if first integer 118 is odd. Reset port 214 is configured to receive delayed second comparison signal 308 if first integer 118 is odd. Counter 104 can be configured to change state in response to a rising edge 310 of clock signal 114 and latch 304 can be configured to change state in response to a falling edge 312 of clock signal 114.

Output signal 202 can have a substantially square waveform when first integer 118 equals the sum of one added to an intermediate product and the intermediate product equals second integer 208 multiplied by two. For example, if first integer 118 is seven and second integer 208 is three, then output signal 202 is set to the high (low) value in response to counter 104 having received the seventh rising edge 310 of clock signal 114 after counter 104 has been reset, which again resets counter 104. Output signal 202 maintains the high (low) value in response to counter 104 having received, in turn, the first falling edge 312, the first rising edge 310, the second falling edge 312, the second rising edge 310, the third falling edge 312, and the third rising edge 310 of clock signal 114 after counter 104 has been reset. Furthermore, second comparison signal 210 is set to the high (low) value in response to counter 104 having received the third rising edge 310 of clock signal 114 after counter 104 has been reset. Thus, the high (low) value of second comparison signal 210 is received by latch 304 in response to counter 104 having received the third rising edge 310 of clock signal 114 after counter 104 has been reset.

However, the high (low) value of delayed second comparison signal 308 is produced by latch 304 in response to counter 104 having received the fourth falling edge 312 of clock signal 114 after counter 104 has been reset. Thus, output signal 202 is set to the low (high) value in response to counter 104 having received the fourth falling edge 312 of clock signal 114 after counter 104 has been reset. Output signal 202 maintains the low (high) value in response to counter 104 having received, in turn, the fourth rising edge 310, the fifth falling edge 312, the fifth rising edge 310, the sixth falling edge 312, the sixth rising edge 310, and the seventh falling edge 312 of clock signal 114 after counter 104 has been reset. Thus, the period of output signal 202 equals seven times the period of clock signal 114 and the duty cycle of output signal 202 equals one-half.

In an alternative embodiment (not shown), bypass 302 is configured to receive first comparison signal 120. Latch 304 is configured to receive first comparison signal 120 and to produce a delayed first comparison signal (not shown). Multiplexer 306 is configured to couple, responsive to a selection, either latch 304 or bypass 302 to set port 212. Multiplexer 306 can be configured to couple bypass 302 to set port 212 if first integer 118 is even and to couple latch 304 to set port 212 if first integer 118 is odd. Set port 212 is configured to receive delayed first comparison signal if first integer 118 is odd. Counter 104 can be configured to change state in response to a rising edge 310 of clock signal 114 and latch 304 can be configured to change state in response to falling edge 312 of clock signal 114.

The skilled artisan understands how to implement variations to either embodiment of frequency divider 300 including, but not limited to: (1) having first integer 118 equal to the difference of one subtracted from the intermediate product when the intermediate product equals second integer 208 multiplied by two; (2) having counter 104 configured to change state in response to falling edge 312 of clock signal 114 and latch 304 configured to change state in response to rising edge 310 of clock signal 114; (3) having multiplexer 306 configured to couple bypass 302 to set port 212 if first integer 118 is odd and to couple latch 304 to set port 212 if first integer 118 is even; and (4) combinations of any of the foregoing.

Figure 4:
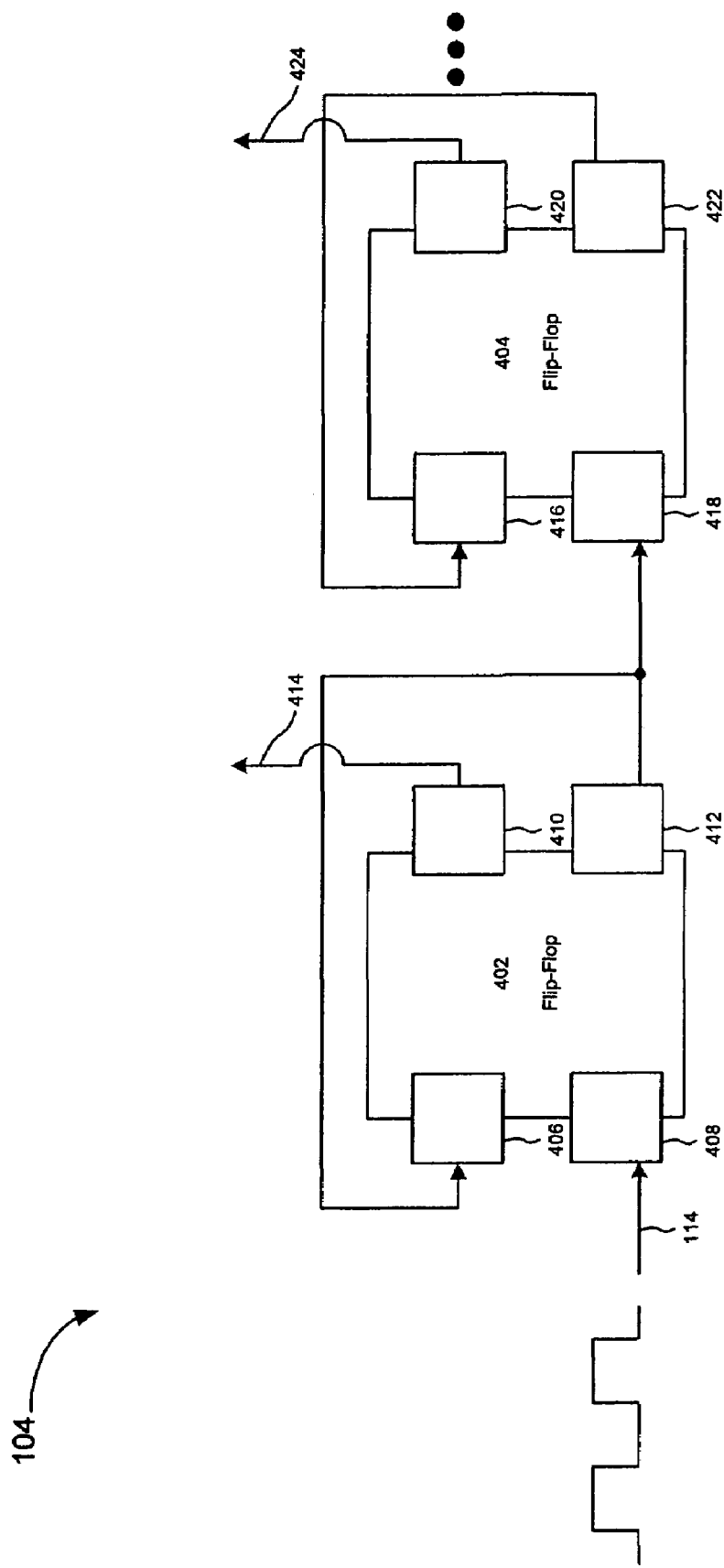
FIG. 4 is a schematic diagram of an embodiment of counter 104.

FIG. 4 is a schematic diagram of an embodiment of counter 104. In FIG. 4, counter 104 comprises a first flip-flop 402 and a second flip-flop 404. First flip-flop 402 has a first input port 406, a first clock input port 408, a first output port 410, and a first opposite output port 412. First flip-flop 402 is configured to receive, at clock input port 408, clock signal 114 and to produce a least significant bit signal 414 of sum signal 116. Second flip-flop 404 is coupled to first flip-flop 402. Second flip-flop 402 has a second input port 416, a second clock input port 418, a second output port 420, and a second opposite output port 422. Second flip-flop 404 is configured to produce a next least significant bit signal 424 of sum signal 116.

First flip-flop 402 and second flip-flop 404 can be coupled according to various configurations, as is understood by the skilled artisan. For example, clock signal 114 can be received at first clock input port 408, least significant bit signal 414 can be provided at first output port 410, first opposite output port 412 can be coupled to first input port 406 and second clock input port 418, next least significant bit signal 424 can be provided at second output port 420, and second opposite output port 422 can be coupled to second input port 416. The skilled artisan also understands that counter 104 can include additional flip-flops coupled, in turn, to second flip-flop 404 and configured to produce sequentially more significant bit signals of sum signal 116.

When counter 104 is reset, sum signal 116 equals the initial integer, which can be zero, one, two, etc. For example, if initial integer is zero, then least significant bit signal 414 and next least significant bit signal 424 are at the low (high) value. This means that first output port 410 and second output port 420 are at the low (high) value, first opposite output port 412 and second opposite output port 422 are at the high (low) value, first input port 406 and second input port 416 are at the high (low) value, and second clock input port 418 is at the high (low) value.

In response to first clock input port 408 having received the first waveform of clock signal 114 after counter 104 has been reset, first output port 410 receives the high (low) value from first input port 406 so that least significant bit signal 414 is at the high (low) value. First opposite output port 412 changes from the high (low) value to the low (high) value. First input port 406 receives the low (high) value from first opposite output port 412. Second clock input port 418 receives the low (high) value from first opposite output port 412. Thus, least significant bit signal 414 is at the high (low) value and next least significant bit signal 424 is at the low (high) value, which corresponds to the binary representation of the number one.

In response to first clock input port 408 having received the second waveform of clock signal 114 after counter 104 has been reset, first output port 410 receives the low (high) value from first input port 406 so that least significant bit signal 414 is at the low (high) value. First opposite output port 412 changes from the low (high) value to the high (low) value. First input port 406 receives the high (low) value from first opposite output port 412. Second clock input port 418 receives the high (low) value from first opposite output port 412. In response to second clock input port 418 having received the high (low) value from first opposite output port 412, second output port 420 receives the high (low) value from second input port 416 so that next least significant bit signal 424 is at the high (low) value. Second opposite output port 422 changes from the high (low) value to the low (high) value. Second input port 416 receives the low (high) value from second opposite output port 422. Thus, least significant bit signal 414 is at the low (high) value and next least significant bit signal 424 is at the high (low) value, which corresponds to the binary representation of the number two.

In response to first clock input port 408 having received the third waveform of clock signal 114 after counter 104 has been reset, first output port 410 receives the high (low) value from first input port 406 so that least significant bit signal 414 is at the high (low) value. First opposite output port 412 changes from the high (low) value to the low (high) value. First input port 406 receives the low (high) value from first opposite output port 412. Second clock input port 418 receives the low (high) value from first opposite output port 412. Thus, least significant bit signal 414 is at the high (low) value and next least significant bit signal 424 is at the high (low) value, which corresponds to the binary representation of the number three.

Advantageously, counter 104 of FIG. 4 is configured so that least significant bit signal 414 and next least significant bit signal 424 can be processed in parallel, which increases the speed of the frequency divider (e.g., frequency divider 100, frequency divider 200, or frequency divider 300) in which counter 104 is incorporated.

Figure 5:
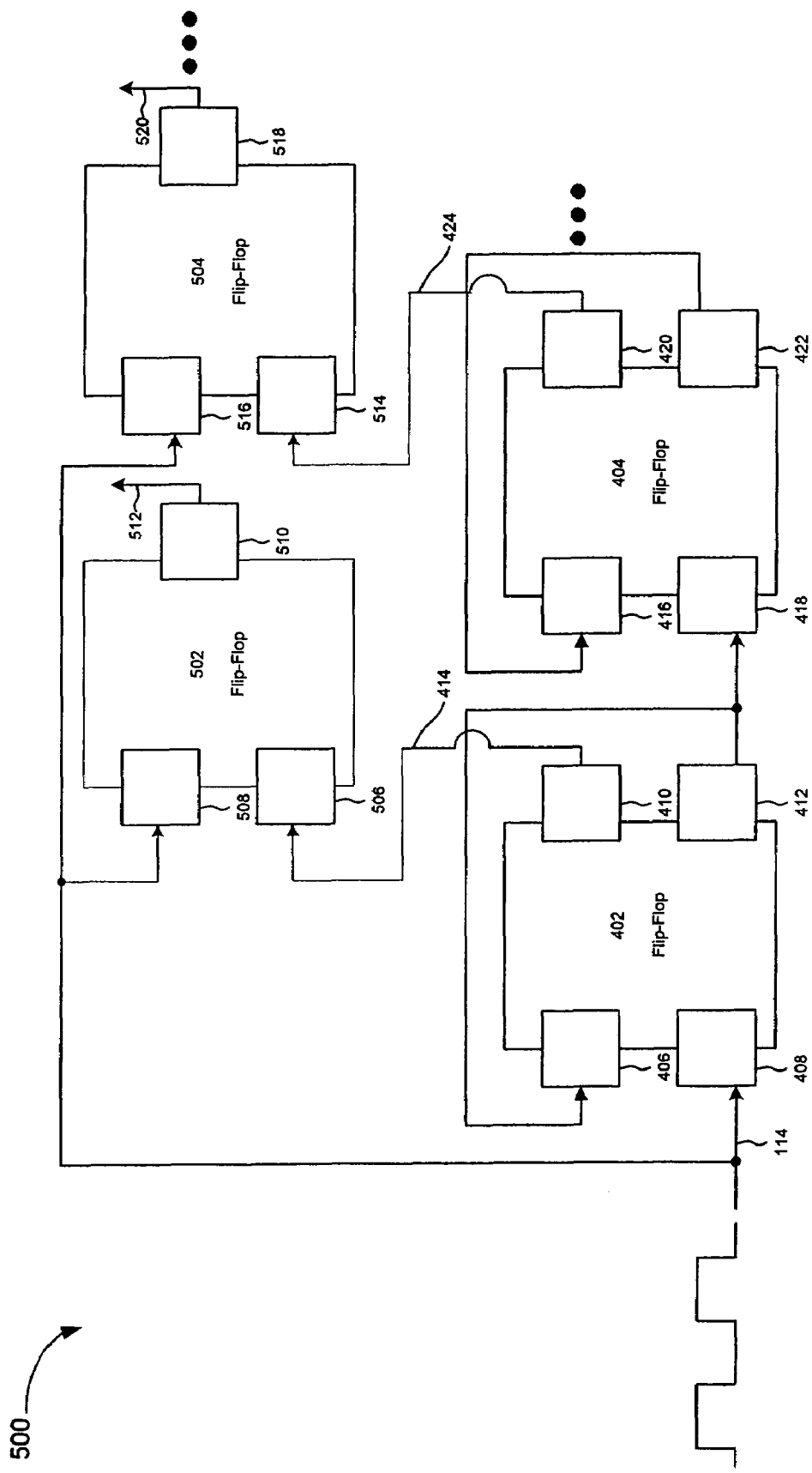
FIG. 5 is a schematic diagram of a counter 500 that can resynchronize least significant bit signal 414 with next least significant bit signal 424.

FIG. 5 is a schematic diagram of a counter 500 that can resynchronize least significant bit signal 414 with next least significant bit signal 424.

Counter 500 modifies counter 104 of FIG. 4 to include a third flip-flop 502 and a fourth flip-flop 504. Third flip-flop 502 has a third input port 506, a third clock input port 508, and a third output port 510. Third input port 506 is configured to receive least significant bit signal 414. Third clock input port 508 is configured to receive clock signal 114. Third output port 510 is configured to produce a delayed least significant bit signal 512. Fourth flip-flop 504 has a fourth input port 514, a fourth clock input port 516, and a fourth output port 518. Fourth input port 514 is configured to receive next least significant bit signal 424. Fourth clock input port 516 is configured to receive clock signal 114. Fourth output port 518 is configured to produce a delayed next least significant bit signal 520. The skilled artisan understands that counter 500 can include additional flip-flops coupled, in turn, to second flip-flop 404 and configured to produce sequentially more significant bit signals of sum signal 116 and coupled to corresponding bit signals and configured to produce corresponding delayed bit signals.

Variations in the lengths of the interconnects along which least significant bit signal 414 and next least significant bit signal 424 are conveyed and variations in gate delays within first flip-flop 402 and second flip-flop 404 can cause least significant bit signal 414 to lose synchronization with next least significant bit signal 424. This can distort the results of subsequent processing. Having least significant bit signal 414 and next least significant bit signal 424 pass through, respectively, third flip-flop 502 and fourth flip-flop 504 delays having sum signal 116 received by first comparator 106 and second comparator 204 by a period of clock signal 114. Although this reduces the speed of the frequency divider (e.g., frequency divider 100, frequency divider 200, or frequency divider 300) in which counter 500 is incorporated, this also resynchronizes least significant bit signal 414 with next least significant bit signal 424 for subsequent processing.

Figure 6:
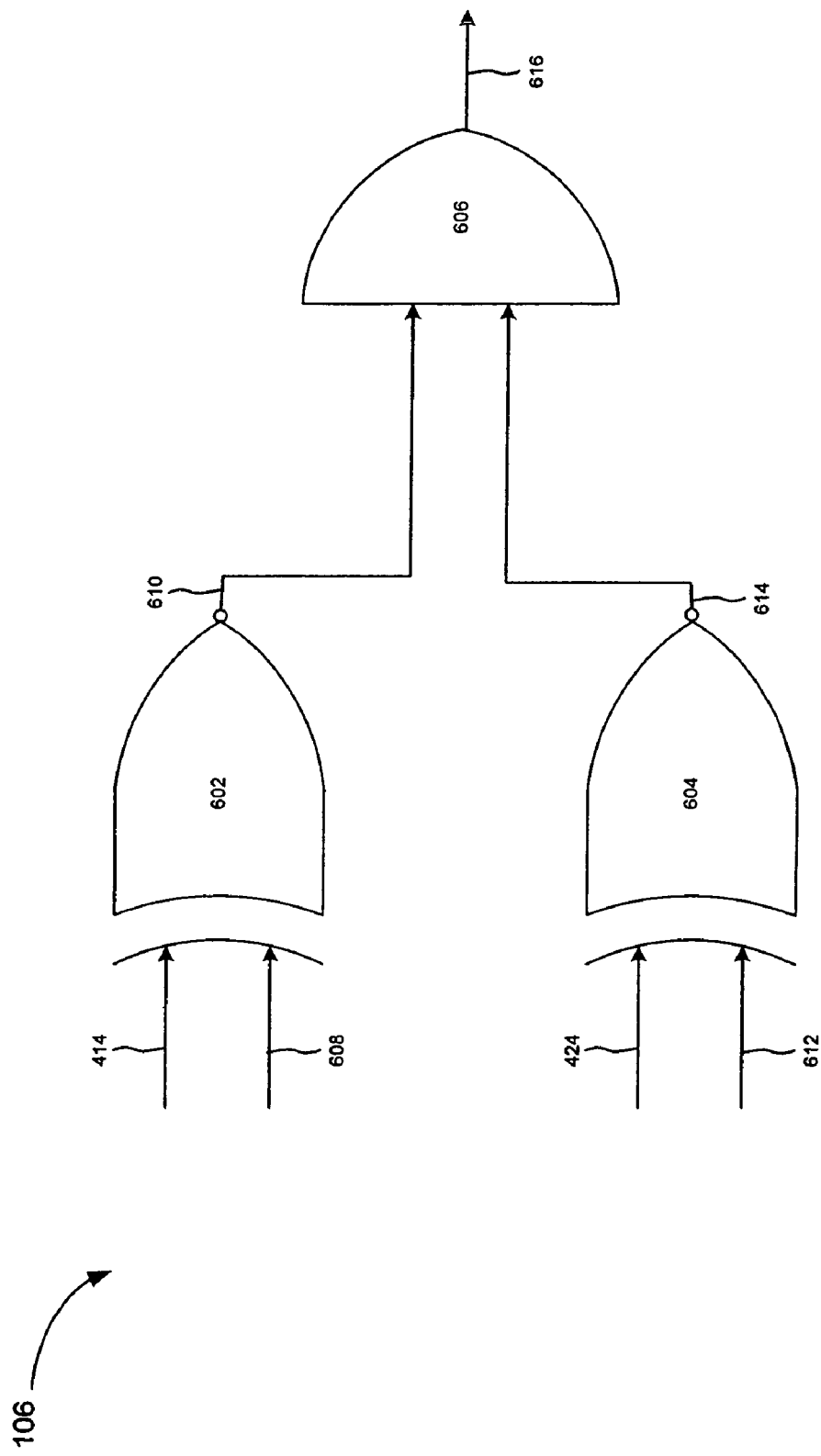
FIG. 6 is a schematic diagram of an embodiment of first comparator 106.

FIG. 6 is a schematic diagram of an embodiment of first comparator 106. In FIG. 6, first comparator 106 comprises a first Exclusive NOR gate 602, a second Exclusive NOR gate 604, and a first AND gate 606. First integer 118 is represented in a binary format. First Exclusive NOR gate 602 is configured to receive least significant bit signal 414 (or delayed least significant bit signal 512), to receive a least significant bit value 608 of first integer 118, and to produce a comparison least significant bit value 610. Second Exclusive NOR gate 604 is configured to receive next least significant bit signal 424 (or delayed next least significant bit signal 520), to receive a next least significant bit value 612 of first integer 118, and to produce a comparison next least significant bit value 614. First AND gate 606 is configured to receive comparison least significant bit value 610, to receive comparison next least significant bit value 614, and to produce at least a first portion 616 of first comparison signal 120.

First portion 616 is set to the high (low) value when least significant bit signal 414 (or delayed least significant bit signal 512) equals least significant bit value 608 and next least significant bit signal 424 (or delayed next least significant bit signal 520) equals next least significant bit value 612. Otherwise, first portion 616 is set to the low (high)

value. The skilled artisan understands that these results can be realized using combinations of other logic gates including, but not limited to inverters, OR gates, NOR gates, Exclusive OR gates, and NAND gates. Second comparator 204 can be configured in a similar manner.

Figure 7:
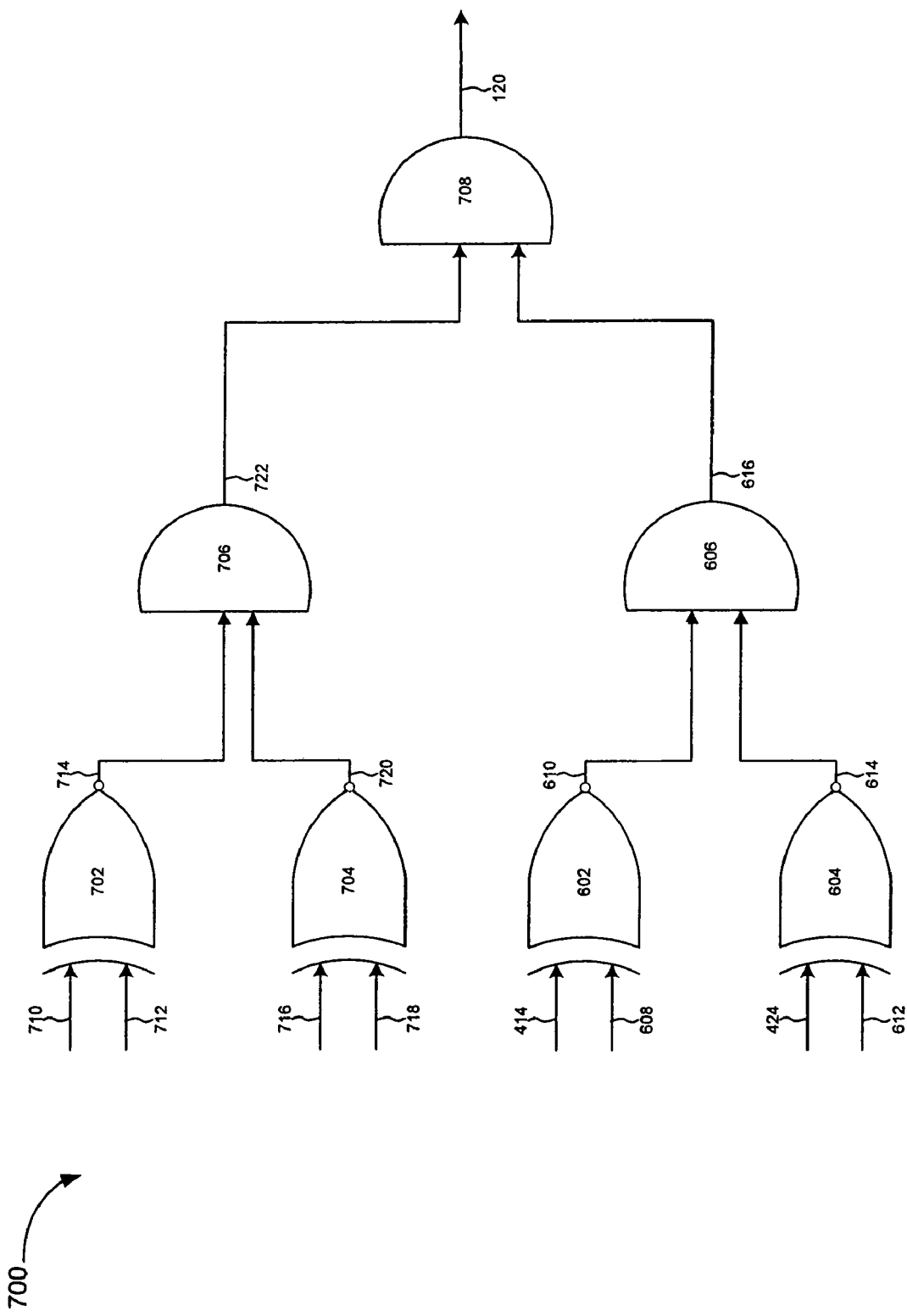
FIG. 7 is a schematic diagram of a first comparator 700 that can accommodate binary formats of first integer 118 having more than two bits.

FIG. 7 is a schematic diagram of a first comparator 700 that can accommodate binary formats of first integer 118 having more than two bits. First comparator 700 modifies first comparator 106 of FIG. 6 to include a third Exclusive NOR gate 702, a fourth Exclusive NOR gate 704, a second AND gate 706, and a third AND gate 708. Third Exclusive NOR gate 702 is configured to receive a second next least significant bit signal 710 (or a delayed second next least significant bit signal), to receive a second next least significant bit value 712 of first integer 118, and to produce a comparison second next least significant bit value 714. Fourth Exclusive NOR gate 704 is configured to receive a third next least significant bit signal 716 (or a delayed third next least significant bit signal), to receive a third next least significant bit value 718 of first integer 118, and to produce a comparison third next least significant bit value 720. Second AND gate 706 is configured to receive comparison second next least significant bit value 714, to receive comparison third next least significant bit value 720, and to produce a second portion 722 of first comparison signal 120. Third AND gate 708 is configured to receive first portion 616 of first comparison signal 120, to receive second portion 722 of first comparison signal 120, and to produce first comparison signal 120.

First comparison signal 120 is set to the high (low) value when least significant bit signal 414 (or delayed least significant bit signal 512) equals least significant bit value 608, next least significant bit signal 424 (or delayed next least significant bit signal 520) equals next least significant bit value 612, second next least significant bit signal 710 (or delayed second next least significant bit signal) equals second next least significant bit value 712, and third next least significant bit signal 716 (or delayed third next least significant bit signal) equals third next least significant bit value 718. Otherwise, first comparison signal 120 is set to the low (high) value.

The skilled artisan understands that these results can be realized using combinations of other logic gates including, but not limited to inverters, OR gates, NOR gates, Exclusive OR gates, and NAND gates. Furthermore, the AND gates and NAND gates can have more than two inputs. The skilled artisan also understands that multiple configurations of first comparator 700 can be coupled together with additional AND gates to accommodate binary formats of first integer 118 having any number of bits. Advantageously, this precludes the problem in which an AND gate with a desired number of inputs is commercially unavailable (e.g., an AND gate with seven inputs). Advantageously, this allows a frequency divider (e.g., frequency divider 100, frequency divider 200, or frequency divider 300) in which first comparator 700 is incorporated to have a fixed configuration and yet be able to receive different values of first integer 118. From an integrated circuit design perspective, a single frequency divider configured to receive different values of first integer 118 consumes less power and less substrate area than multiple frequency dividers. Second comparator 204 can be configured in a similar manner.

Figure 8:
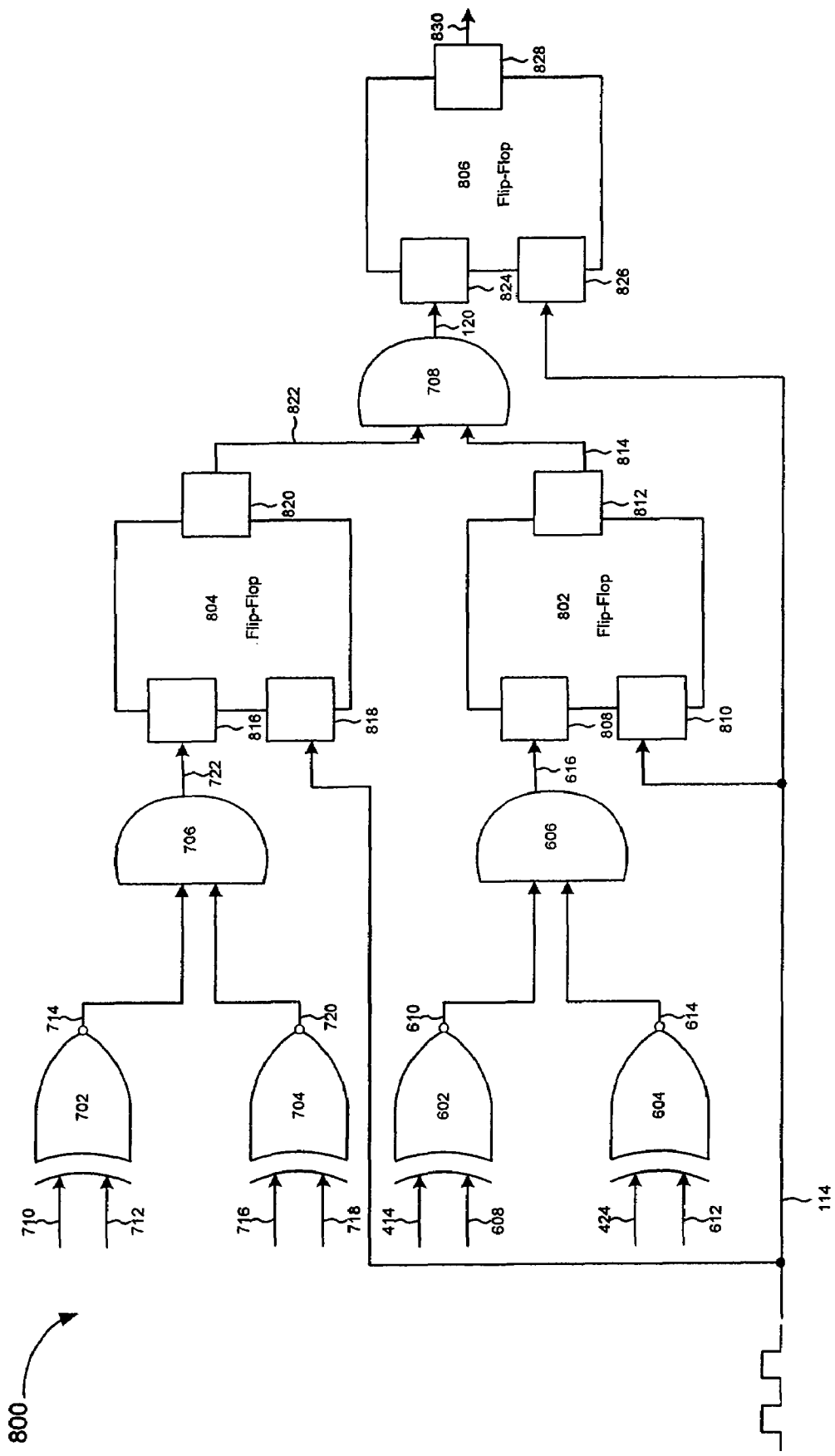
FIG. 8 is a schematic diagram of a first comparator 800 that can resynchronize first portion 616 with second portion 722 and can resynchronize first comparison signal 120 with second comparison signal 210.

FIG. 8 is a schematic diagram of a first comparator 800 that can resynchronize first portion 616 with second portion 722 and can resynchronize first comparison signal 120 with second comparison signal 210. In a first embodiment, first comparator 800 modifies first comparator 700 to include a first flip-flop 802 and a second flip-flop 804. In a second embodiment, first comparator 800 modifies first comparator 700 to include a third flip-flop 806. A third embodiment includes the features of both the first embodiment and the second embodiment.

In the first embodiment, first flip-flop 802 has a first input port 808, a first clock input port 810, and a first output port 812. First input port 802 is configured to receive first portion 616 of first comparison signal 120. First clock input port 810 is configured to receive clock signal 114. First output port 812 is configured to produce a delayed first portion 814 of first comparison signal 120. Second flip-flop 804 has a second input port 816, a second clock input port 818, and a second output port 820. Second input port 816 is configured to receive second portion 722 of first comparison signal 120. Second clock input port 818 is configured to receive clock signal 114. Second output port 820 is configured to produce a delayed second portion 822 of first comparison signal 120. Second comparator 204 can be configured in a similar manner.

Variations in the lengths of the interconnects along which first portion 616 of first comparison signal 120 and second portion 722 of first comparison signal 120 are conveyed and variations in gate delays among first Exclusive NOR gate 602, second Exclusive NOR gate 604, third Exclusive NOR gate 702, fourth Exclusive NOR gate 704, first AND gate 606, and second AND gate 706 can cause first portion 616 of first comparison signal 120 to lose synchronization with second portion 722 of first comparison signal 120. This can distort the results of subsequent processing. Having first portion 616 of first comparison signal 120 and second portion 722 of first comparison signal 120 pass through, respectively, first flip-flop 802 and second flip-flop 804 delays having first comparison signal 120 received by flip-flop 206 (see FIG. 2) by a period of clock signal 114. Although first flip-flop 802 and second flip-flop 804 introduce latency in the signal path, first flip-flop 802 and second flip-flop 804 resynchronize first portion 616 of first comparison signal 120 with second portion 722 of first comparison signal 120 for subsequent processing, thus improving the speed of the frequency divider (e.g., frequency divider 100, frequency divider 200, or frequency divider 300) in which first comparator 800 is incorporated.

In the second embodiment, third flip-flop 806 has a third input port 824, a third clock input port 826, and a third output port 828. Third input port 824 is configured to receive first comparison signal 120. Third clock input port 826 is configured to receive clock signal 114. Third output port 828 is configured to produce a delayed first comparison signal 828. Second comparator 204 can be configured in a similar manner.

Variations in the lengths of the interconnects along which first comparison signal 120 and second comparison signal 210 (see FIG. 2) are conveyed and variations in gate delays between third AND gate 708 and a corresponding AND gate (not shown) for second comparator 204 (see FIG. 2) can cause first comparison signal 120 to lose synchronization with second comparison signal 210 (see FIG. 2). This can distort the results of subsequent processing. Having first comparison signal 120 pass through third flip-flop 806 and second comparison signal 210 (see FIG. 2) pass through a corresponding flip-flop (not shown) delays having first comparison signal 120 and second comparison signal 210 (see FIG. 2) received by flip-flop 206 (see FIG. 2) by a period of clock signal 114. Although third flip-flop 806 and the corresponding flip-flop (not shown) introduce latency in the signal path, third flip-flop 806 and the corresponding flip-flop (not shown) resynchronize first comparison signal 120 with second comparison signal 210 (see FIG. 2) for subsequent processing, thus improving the speed of the frequency divider (e.g., frequency divider 100, frequency divider 200, or frequency divider 300) in which first comparator 800 is incorporated.

In an embodiment, the frequency divider (e.g., frequency divider 200 or frequency divider 300) includes third flip-flop 502, fourth flip-flop 504, first flip-flop 802, second flip-flop 804, and third flip-flop 806 and first integer 118 has a binary format with six bits.

Third flip-flop 502 and fourth flip-flop 504 delay having sum signal 116 received by first comparator 106 by a period of clock signal 114. In other words, because of third flip-flop 502 and fourth flip-flop 504, sum signal 116 does not reflect counter 104 having received the first waveform of clock signal 114 after counter 104 has been reset until counter 104 has received the second waveform of clock signal 114 after counter 104 has been reset. Having the initial integer equal to one so that sum signal 116 is set to one when counter 104 is reset compensates for this situation.

Typically, by having a binary format with six bits, first integer 118 can be selected from the set of integers ranging from one to sixty-three. (Because first integer 118 is the number by which the frequency of clock signal 114 is divided, first integer 118 cannot be set to zero.) However, first flip-flop 802, second flip-flop 804, and third flip-flop 806 delay having first comparison signal 120 received by flip-flop 206 by two periods of clock signal 114. In other words, because of first flip-flop 802, second flip-flop 804, and third flip-flop 806, first comparison signal 120 does not reflect that the number of waveforms of clock signal 114 received by counter 104 after counter 104 has been reset equals first integer 118 until after two additional waveforms of clock signal 114 have been received by first comparator 106. This effectively shifts by two the range of the numbers that the six bits can represent. Thus, first integer 118 can be selected from the set of integers ranging from three to sixty-five.

Figure 9:
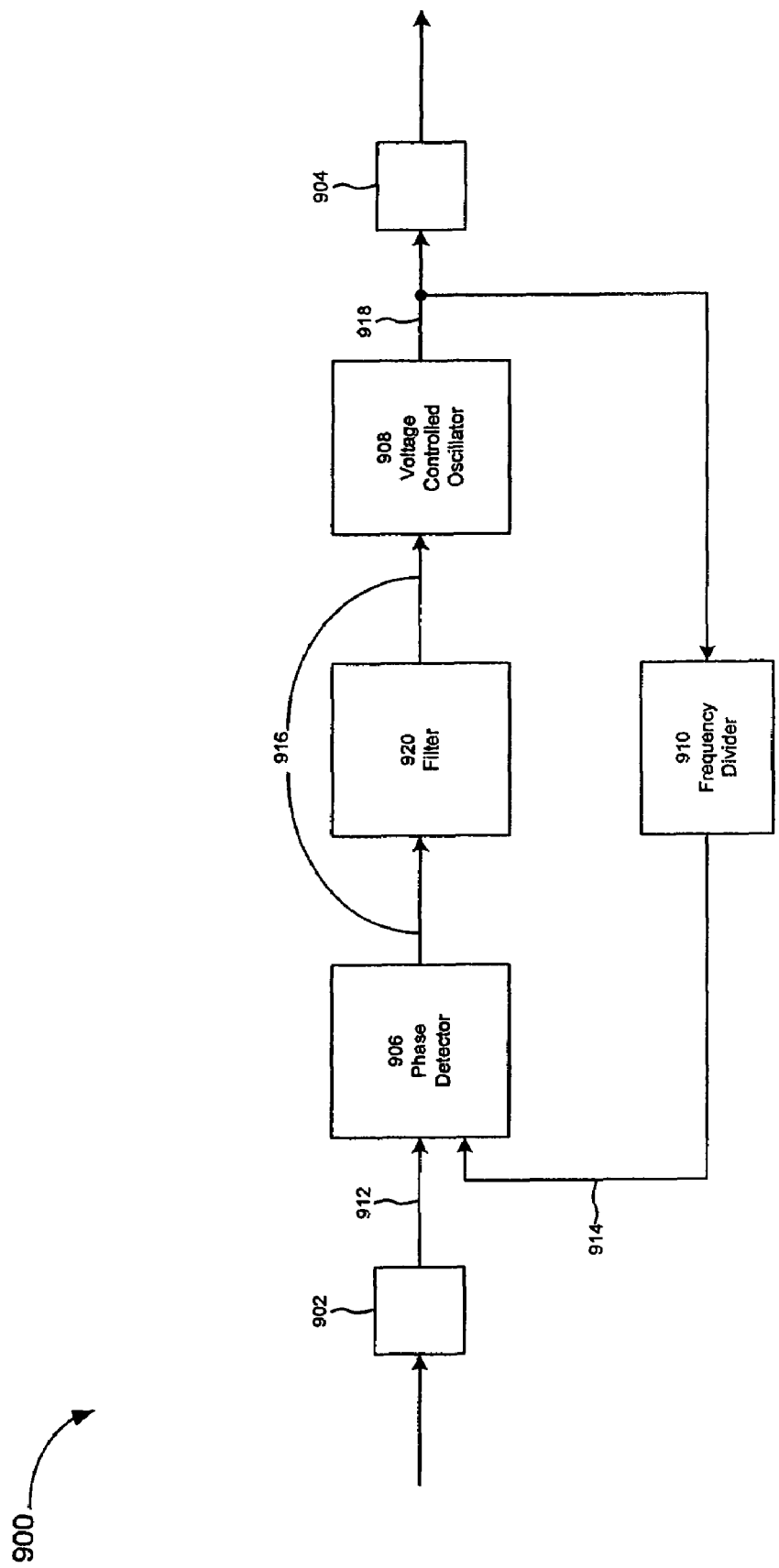
FIG. 9 is a block diagram of a phase locked loop 900.

The present invention also relates to phase locked loops. FIG. 9 is a block diagram of a phase locked loop 900. Phase locked loop 900 comprises an input 902, an output 904, a phase detector 906, a voltage controlled oscillator 908, and a frequency divider 910. Phase detector 906 is configured to receive, from input 902, a first signal 912, to receive a second signal 914, and to produce a third signal 916. First signal 912 has a first frequency. Second signal 914 has a second frequency. Voltage controlled oscillator 908 is configured to receive third signal 916 and to provide, to output 904, a fourth signal 918. Fourth signal 918 has a third frequency. Frequency divider 910 is configured to receive fourth signal 918 and to produce second signal 914. The second frequency (of second signal 914) equals the quotient of the third frequency (of fourth signal 918) divided by an integer. Optionally, phase locked loop 900 further comprises a filter 920 coupled between phase detector 906 and voltage controlled oscillator 908. The skilled artisan understands that operation of phase locked loop 900 causes fourth signal 918 to have the third frequency. Optionally, an additional frequency divider (not shown) can be coupled to input 902, output 904, or both.

In a first embodiment, the integer is selectable from a set of at least three consecutive integers. A smallest integer of the at least three consecutive integers can be three. In a second embodiment, the third frequency is at least 1.5 gigahertz and frequency divider 910 is formed using complementary metal oxide semiconductor processing technology. A third embodiment includes the features of both the first embodiment and the second embodiment.

Figure 10:
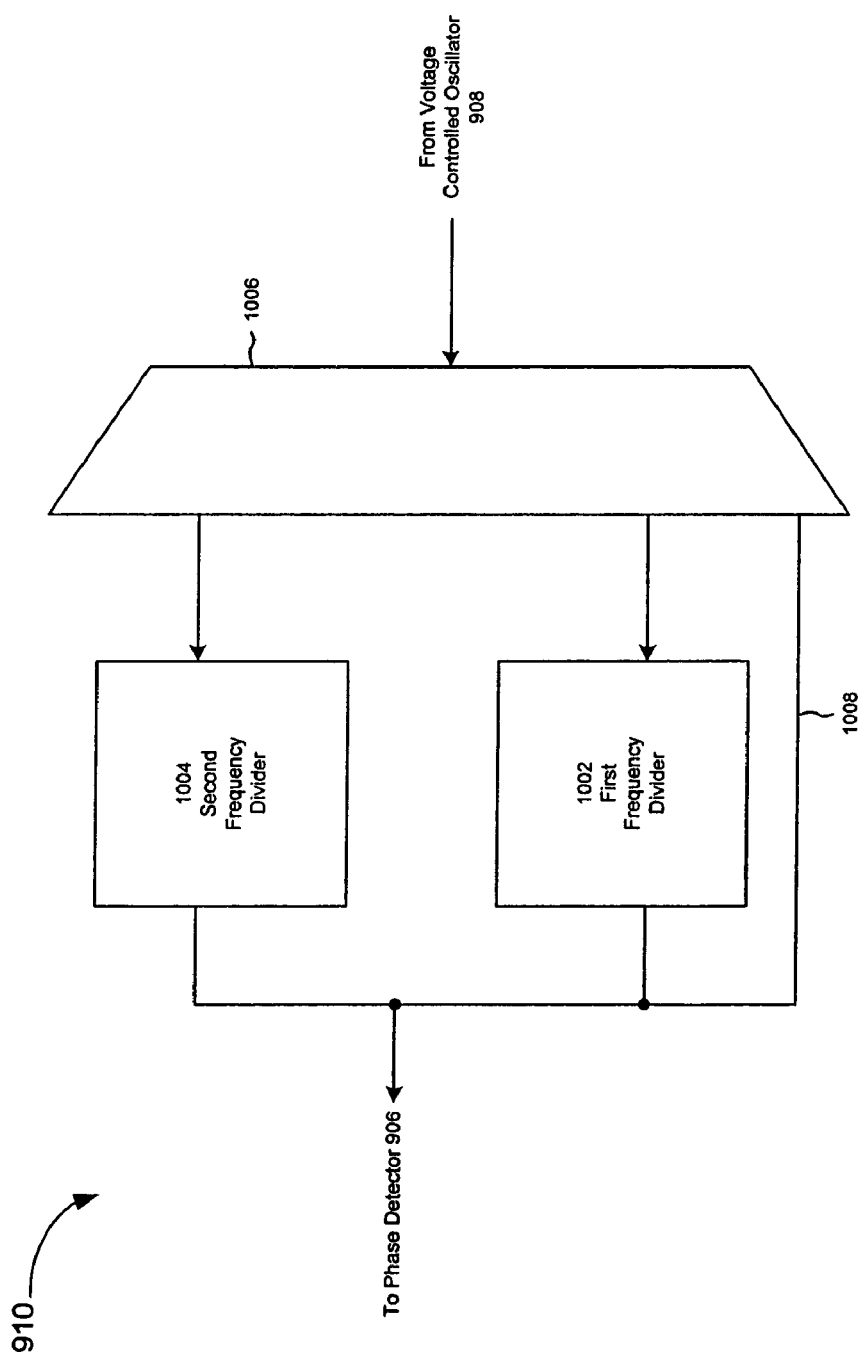
FIG. 10 is a block diagram of an embodiment of frequency divider 910.

FIG. 10 is a block diagram of an embodiment of frequency divider 910. In FIG. 10, frequency divider 910 comprises a first frequency divider 1002, a second frequency divider 1004, and a multiplexer 1006. First frequency divider 1002 is configured to divide the third frequency by two. Second frequency divider 1004 is configured to divide the third frequency by at least three. For example, second frequency divider 1004 can be, but is not limited to, frequency divider 100, frequency divider 200, or frequency divider 300. Multiplexer 1006 is configured to couple, responsive to a selection, either first frequency divider 1002 or second frequency divider 1004 to voltage controlled oscillator 908. (Alternatively, multiplexer 1006 is configured to couple, responsive to a selection, either first frequency divider 1002 or second frequency divider 1004 to phase detector 906 (not shown).) Optionally, frequency divider 910 further comprises a bypass 1008 coupled to multiplexer 1006. With this option, multiplexer 1006 is configured to couple, responsive to a selection, one of first frequency divider 1002, second frequency divider 1004, and bypass 1008 to voltage controlled oscillator 908. (Alternatively with this option, multiplexer 1006 is configured to couple, responsive to a selection, one of first frequency divider 1002, second frequency divider 1004, and bypass 1008 to phase detector 906 (not shown).)

Figure 11:
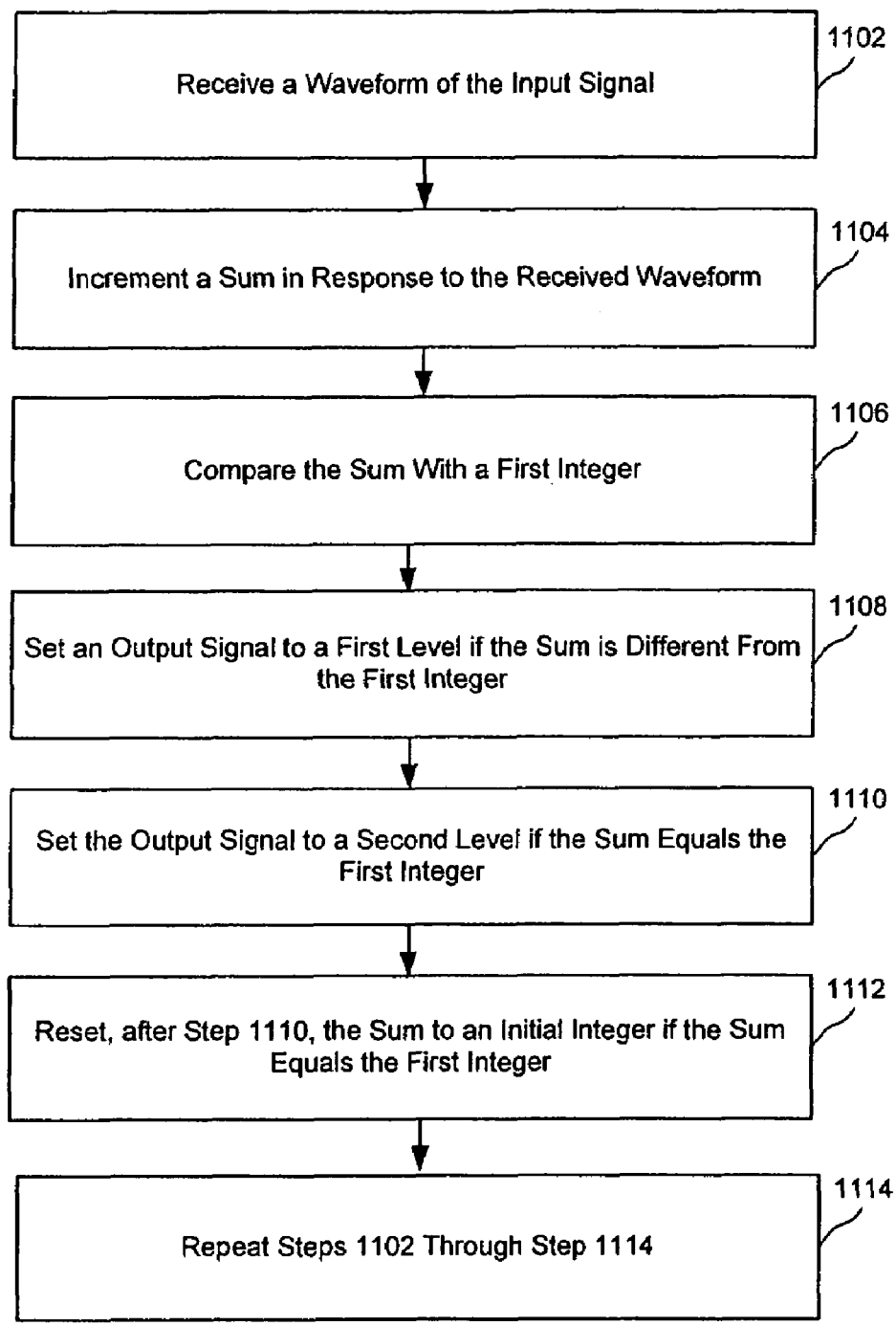
FIG. 11 is a flow chart of a method 1100 for dividing a frequency of an input signal having a periodic waveform.

The present invention also relates to methods for dividing a frequency of an input signal having a periodic waveform. FIG. 11 is a flow chart of a method 1100 for dividing a frequency of an input signal having a periodic waveform. In method 1100, at a step 1102, a waveform of the input signal is received. At a step 1104, a sum is incremented in response to the received waveform. For example, the waveform can be received by a counter. At a step 1106, the sum is compared with a first integer. For example, an output of the counter can be received by a comparator. At a step 1108, an output signal is set to a first level if the sum is different from the first integer. At a step 1110, the output signal is set to a second level if the sum equals the first integer. For example, an output of the comparator can set the output signal to the first level or the second level. After step 1110, at a step 1112, the sum is reset to an initial integer if the sum equals the first integer. For example, the output of the comparator can be used to reset the counter. At a step 1114, steps 1102 through 1114 are repeated. The first integer is selectable from a set of at least three consecutive integers. The first level is either a high level or a low level. The second level is also either a high level or a low level, but the second level is different from the first level.

Figure 12:
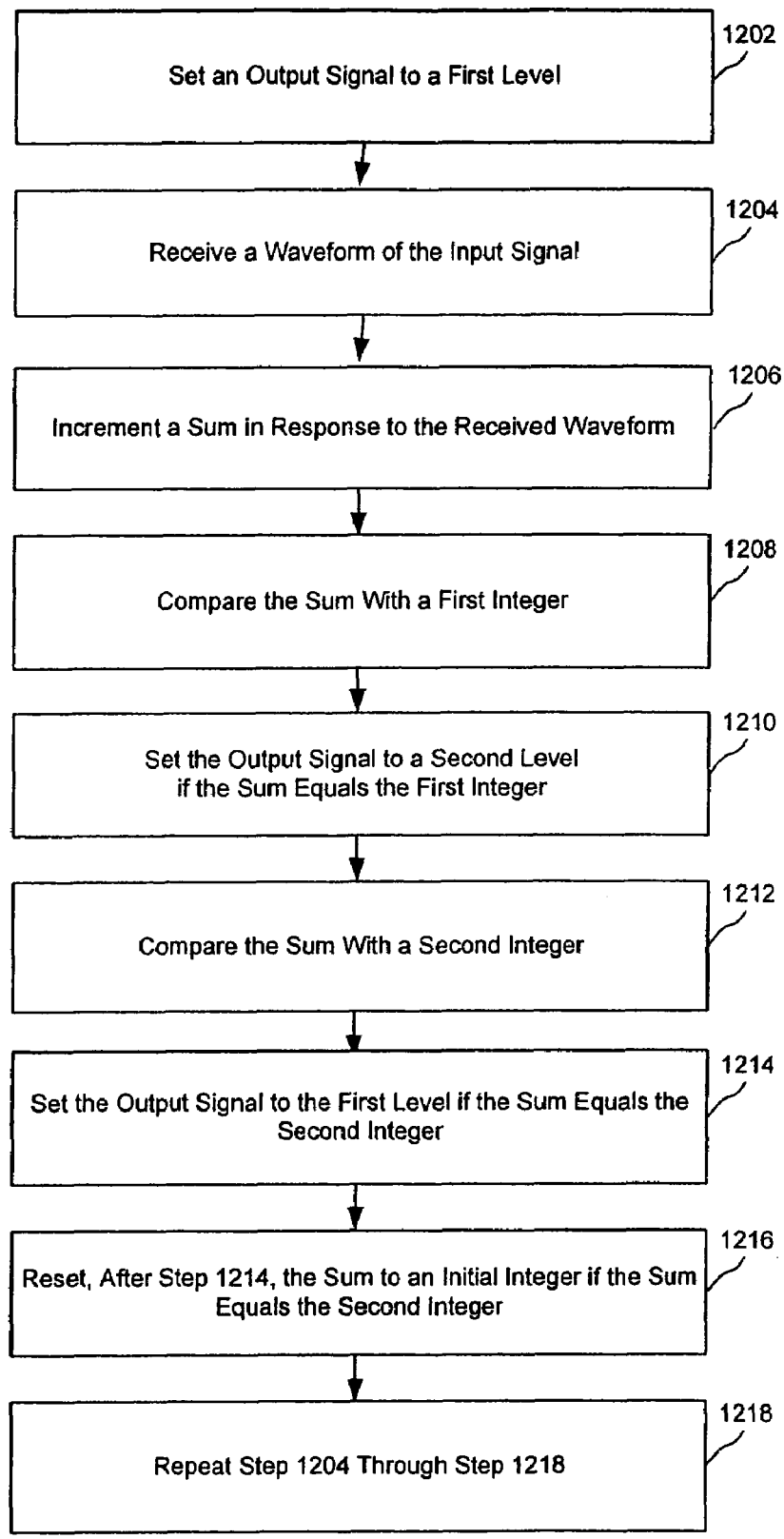
FIG. 12 is a flow chart of a method 1200 for dividing a frequency of an input signal having a periodic waveform.

FIG. 12 is a flow chart of a method 1200 for dividing a frequency of an input signal having a periodic waveform. In method 1200, at a step 1202, an output signal is set to a first level. At a step 1204, a waveform of the input signal is received. At a step 1206, a sum is incremented in response to the received waveform. For example, the waveform can be received by a counter. At a step 1208, the sum is compared with a first integer. For example, an output of the counter can be received by a first comparator. At a step 1210, the output signal is set to a second level if the sum equals the first integer. For example, an output of the first comparator can be received by a flip-flop, which can set the output signal to the second level. At a step 1212, the sum is compared with a second integer. For example, the output of the counter can be received by a second comparator. At a step 1214, the output signal is set to the first level if the sum equals the second integer. For example, the output of the second comparator can be received by the flip-flop, which can set the output signal to the first level. After step 1214, at a step 1216, the sum is reset to an initial integer if the sum equals the second integer. For example, the output of the second comparator can be used to reset the counter. At a step 1218, steps 1204 through 1218 are repeated.

The second integer is greater than the first integer. The second integer can equal the first integer multiplied by two. Alternatively, the second integer can equal the sum of one added to an intermediate product or the difference of one subtracted from the intermediate product. The intermediate product equals the first integer multiplied by two. In this situation either setting the output signal to the second level at step 1210 can be delayed by a half period of the periodic waveform or setting the output signal to the first level at step 1214 can be delayed by a half period of the periodic waveform. The second integer is selectable from a set of at least three consecutive integers The first level is either a high level or a low level. The second level is also either a high level or a low level, but the second level is different from the first level.

CONCLUSION

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A frequency divider, comprising:
an input;
a counter having a counter reset port and configured to receive a clock signal from the input and to produce a sum signal;
a first comparator configured to receive the sum signal, to compare the sum signal to a first integer, and to produce a first comparison signal;
an interconnect configured to convey the first comparison signal from the first comparator to the counter reset port;
a second comparator configured to receive the sum signal, to compare the sum signal to a second integer, and to produce a second comparison signal;
a first flip-flop having a set port and a reset port and configured to receive the first comparison signal at the set port, to receive the second comparison signal at the reset port, and to produce an output signal; and
an output coupled to the first flip-flop;
wherein the clock signal has a periodic waveform, the sum signal represents a first sum, the first sum equals a number of waveforms of the clock signal received by the counter after the counter has been reset, the first integer is selectable from a range of at least three consecutive integers, and the first integer is greater than the second integer.

2. The frequency divider of claim 1, wherein the first integer equals the second integer multiplied by two.

3. The frequency divider of claim 1, further comprising:
a bypass configured to receive a signal;
a latch configured to receive the signal and to produce a delayed signal; and
a multiplexer configured to couple, responsive to a selection, one of the latch and the bypass to a port;

wherein the port is the set port and the delayed signal is a delayed first comparison signal in response to the signal being the first comparison signal and the port is the reset port and the delayed signal is a delayed second comparison signal in response to the signal being the second comparison signal.

4. The frequency divider of claim 3, wherein the multiplexer is configured to couple the bypass to the port in response to the first integer having a first state, the multiplexer is configured to couple the latch to the port in response to the first integer having a second state, the port is configured to receive the delayed signal in response to the first integer having the second state, the first state is one of even and odd, the second state is one of even and odd, and the first state is different from the second state.

5. The frequency divider of claim 3, wherein the first integer equals one of one added to an intermediate product and one subtracted from the intermediate product and the intermediate product equals the second integer multiplied by two.

6. The frequency divider of claim 3, wherein the counter is configured to change state in response to a first edge of the periodic waveform, the latch is configured to change state in response to a second edge of the periodic waveform, the first edge is one of a rising edge and a falling edge, the second edge is one of the rising edge and the falling edge, and the first edge is different from the second edge.

7. A frequency divider, comprising:
an input;
a first flip-flop having a reset port, first input port, a first clock input port, a first output port, and a first opposite output port, and configured to receive, at the first clock input port, a clock signal from the input and to produce a least significant bit signal of a sum signal;
a second flip-flop coupled to the first flip-flop and having a second input port, a second clock input port, a second output port, and a second opposite output port, and configured to receive, at the second clock input port, an output from the first opposite output port and to produce a next least significant bit signal of the sum signal;
a third flip-flop having a third input port, a third clock input port, and a third output port, wherein the third input port is configured to receive the least significant bit signal, the third clock input port is configured to receive the clock signal, and the third output is configured to produce a delayed least significant bit signal;
a fourth flip-flop having a fourth input port, a fourth clock input port, and a fourth output port, wherein the fourth input port is configured to receive the next least significant bit signal, the fourth clock input port is configured to receive the clock signal, and the fourth output is configured to produce a delayed next least significant bit signal;
a first comparator configured to receive the sum signal, to compare the sum signal to a first integer, and to produce a first comparison signal;
an interconnect configured to convey the first comparison signal from the first comparator to the reset port; and
an output coupled to the first comparator;
wherein the clock signal has a periodic waveform, the sum signal represents a first sum, the first sum equals a number of waveforms of the clock signal received by the first flip-flop after the first flip-flop has been reset, the first integer is selectable from a range of at least three consecutive integers.

8. A frequency divider, comprising:

an input;

a counter having a counter reset port and configured to receive a clock signal from the input and to produce a sum signal;

a first Exclusive NOR gate configured to receive a least significant bit signal of the sum signal, to receive a least significant bit value of a first integer, and to produce a comparison least significant bit value of a first comparison signal;

a second Exclusive NOR gate configured to receive a next least significant bit signal of the sum signal, to receive a next least significant bit value of the first integer, and to produce a comparison next least significant bit value of the first comparison signal;

a first AND gate configured to receive the comparison least significant bit value, to receive the comparison next least significant bit value, and to produce at least a first portion of the first comparison signal;

a third Exclusive NOR gate configured to receive a second next least significant bit signal of the sum signal, to receive a second next least significant bit value of the first integer, and to produce a comparison second next least significant bit value;

a fourth Exclusive NOR gate configured to receive a third next least significant bit signal of the sum signal, to receive a third next least significant bit value of the first integer, and to produce a comparison third next least significant bit value;

a second AND gate configured to receive the comparison second next least significant bit value, to receive the comparison third next least significant bit value, and to produce a second portion of the first comparison signal; and a third AND gate configured to receive the first portion of the first comparison signal, to receive the second portion of the first comparison signal, and to produce the first comparison signal;

an interconnect configured to convey the first comparison signal from the third AND gate to the counter reset port; and an output coupled to the third AND gate;

wherein the clock signal has a periodic waveform, the sum signal represents a first sum, the first sum equals a number of waveforms of the clock signal received by the counter after the counter has been reset, and the first integer is selectable from a range of at least three consecutive integers.

9. The frequency divider of claim 8, further comprising:

a flip-flop having an input port, a clock input port, and an output port, wherein the input port is configured to receive the first comparison signal, the clock input port is configured to receive the clock signal, and the output port is configured to produce a delayed first comparison signal.

10. A method for dividing a frequency of an input signal having a periodic waveform, comprising the steps of:

(1) setting an output signal at a node to a first level;

(2) receiving a waveform of the input signal;

(3) incrementing a sum in response to the received waveform;

(4) comparing, at a first time, the sum with a first integer;

(5) setting, at a second time, the output signal at the node to a second level in response to the sum, at the first time, being equal to the first integer;

(6) comparing, at the first time, the sum with a second integer;

(7) setting, at the second time, the output signal at the node to the first level in response to the sum, at the first time, being equal to the second integer;

(8) resetting, after step (7), the sum to an initial integer in response to the sum being equal to the second integer; and (9) repeating step (2) through step (9);

wherein a difference between the first time and the second time is less than four waveforms of the input signal, the first level is one of a high level and a low level, the second level is one of the high level and the low level, and the first level is different from the second level.

11. A method for dividing a frequency of an input signal having a periodic waveform, comprising the steps of:

(1) setting an output signal to a first level;

(2) receiving a waveform of the input signal;

(3) incrementing a sum in response to the received waveform;

(4) comparing the sum with a first integer;

(5) setting the output signal to a second level in response to the sum being equal to the first integer;

(6) comparing the sum with a second integer;

(7) setting the output signal to the first level in response to the sum being equal to the second integer;

(8) resetting, after step (7), the sum to an initial integer in response to the sum being equal to the second integer; and (9) repeating step (2) through step (9);

wherein the second integer equals the first integer multiplied by two, the second integer is selectable from a range of at least three consecutive integers, the first level is one of a high level and a low level, the second level is one of the high level and the low level, and the first level is different from the second level.

12. A method for dividing a frequency of an input signal having a periodic waveform, comprising the steps of:

(1) setting an output signal to a first level;

(2) receiving a waveform of the input signal;

(3) incrementing a sum in response to the received waveform;

(4) comparing the sum with a first integer;

(5) setting the output signal to a second level if in response to the sum being equal to the first integer;

(6) comparing the sum with a second integer;

(7) setting the output signal to the first level if in response to the sum being equal to the second integer;

(8) resetting, after step (7), the sum to an initial integer in response to the sum being equal to the second integer; and (9) repeating step (2) through step (9);

wherein the second integer is greater than the first integer, the second integer is selectable from a range of at least three consecutive integers, the second integer equals one of one added to an intermediate product and one subtracted from the intermediate product, the intermediate product equals the first integer multiplied by two, the first level is one of a high level and a low level, the second level is one of the high level and the low level, and the first level is different from the second level.

13. The method of claim 12, wherein one of the setting the output signal to the second level in response to the sum being equal to the first integer and the setting the output signal to the first level in response to the sum being equal to the second integer is delayed by a half period of the periodic waveform.

* * * * *

UNITED STATES PATENT AND TRADEMARK OFFICE
CERTIFICATE OF CORRECTION

PATENT NO. : 7,358,782 B2  Page 1 of 1
APPLICATION NO. : 11/350143
DATED : April 15, 2008
INVENTOR(S) : Khanoyan et al.

It is certified that error appears in the above-identified patent and that said Letters Patent is hereby corrected as shown below:

Column 16
Line 42, please replace "setting the output signal to a second level if in response" with --setting the output signal to a second level in response--.
Line 45, please replace "setting the output signal to the first level if in response" with --setting the output signal to the first level in response--.

Signed and Sealed this

Twelfth Day of August, 2008

JON W. DUDAS
*Director of the United States Patent and Trademark Office*